United States Patent [19]

Sudo

[11] Patent Number: 4,922,324

[45] Date of Patent: May 1, 1990

[54] SEMICONDUCTOR INTEGRATED CIRCUIT DEVICE

[75] Inventor: Toshio Sudo, Kawasaki, Japan

[73] Assignee: Kabushiki Kaisha Toshiba, Kanagawa, Japan

[21] Appl. No.: 145,305

[22] Filed: Jan. 19, 1988

[30] Foreign Application Priority Data

Jan. 20, 1987 [JP] Japan ................................. 62-10338

[51] Int. Cl.$^5$ ..................... H01L 23/14; H01L 23/10; H01L 23/36; H01L 23/52

[52] U.S. Cl. ........................................ 357/74; 357/70; 357/80; 357/75

[58] Field of Search ...................... 357/74, 81, 70, 72, 357/80, 75; 174/52 FP

[56] References Cited

U.S. PATENT DOCUMENTS

| | | | |
|---|---|---|---|
| 4,551,747 | 11/1985 | Gilbert et al. | 357/74 |
| 4,611,882 | 9/1986 | Ushida | 357/74 |
| 4,667,219 | 5/1987 | Lee et al. | 357/74 |
| 4,705,917 | 11/1987 | Gates, Jr. et al. | 357/74 |

OTHER PUBLICATIONS

Pengue et al., "The Quick-Chip A Depletion Mode Digital/Analog Arrays," GaAs IC Symposium Technical Digest, pp. 27-30, 1984.

Primary Examiner—Rolf Hille
Assistant Examiner—S. V. Clark
Attorney, Agent, or Firm—Finnegan, Henderson, Farabow, Garrett and Dunner

[57] ABSTRACT

A semiconductor integrated circuit device has a package base and a cavity formed with a ground electrode layer thereon. A semiconductor integrated circuit chip is providing on the ground electrode layer. De-coupling capacitors are providing on the surface of the cavity. A ground metal plate and outer leads are formed on the surface of the bottom of the package base. A metal connector is providing through the package base to connect electrically and thermally, the ground electode layer and the ground metal plate.

16 Claims, 3 Drawing Sheets

SEMICONDUCTOR INTEGRATED CIRCUIT DEVICE

BACKGROUND OF THE INVENTION

1. Field of the Invention

This invention relates generally to semiconductor integrated circuit devices having high speed semiconductor logic elements therein.

2. Description of the Prior Art

Recently, with the development of compound semiconductor elements, high speed logic operations have become used in semiconductor integrated circuits. In particular, GaAs logic integrated circuits using field effect transistors on a GaAs substrate are common.

However, the excellent high speed performance of a GaAs integrated circuit chip itself is harmed if the GaAs chip is packed within the same package used for silicon integrated circuits. Namely, sharp transient current flows in the power supply line when inner logic elements switch at high speeds causing a power supply voltage drop due to the inductance of the power supply lines. For example, if the transient current flowing in the power supply lines during the switching time of 100 psec is 10 mA and the inductance of the power supply lines in the package is 2 nH, power supply voltage drops become about 2 mV This power supply voltage disturbance will unstabilize the operation of inner logic elements. Since the noise margins of the logic element using the GaAs MESFET are very small, the minute disturbance of the power supply voltage prevents normal operation. Therefore, the high speed switching operation will be difficult.

In conventional low speed integrated circuits, the above-mentioned power supply voltage disturbance has been disolved by of a connection the de-coupling condensor between the power supply line and the ground line outside of the package. However, in high speed circuits, e.g., in the GaAs logic integrated circuit, the effect of the inductance of the power supply line inside the package is not compensated for by a capacitor connected outside of the package.

There are others reasons it is difficult to pack the GaAs logic integrated circuit into the conventional package of a low speed integrated circuit. For example, the reflection of the high frequency signal due to the unmatching of the characteristic impedance of the wirings within the package, the crosstalk between signal wirings within the package, and the unmatching of characteristic impedances between the wiring within the package and microstrip line on a printed circuit in assembling the GaAs logic integrated circuit on the printed circuit.

BRIEF SUMMARY OF THE INVENTION

It is an object of the invention is to provide a semiconductor integrated circuit device having an improved package utilizing high speed devices.

Briefly, in accordance with one aspect of the invention, there is a semiconductor integrated circuit device having a package base and a cavity formed with a ground electrode layer thereon. A semiconductor integrated circuit chip is providing on the ground electrode layer. De-coupling capacitors are providing on the surface of the cavity. A ground metal plate and outer leads are formed on the surface of the bottom of the package base. A metal connection means is providing through the package base to connect electrically and thermally between the ground electrode layer and the ground metal plate.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein:

FIGS. 1 through 3 are diagrams illustrating schematic configurations of a package using a semiconductor integrated circuit device according to one embodiment of the invention; wherein FIG. 1 is a plan view, FIG. 2 is a cross sectional view taken along line A—A of FIG. 1, and FIG. 3 is a cross sectional view taken along line B—B line of FIG. 1;

FIGS. 5 and 6 are diagrams illustrating schematic configurations of a semiconductor integrated circuit device according to one embodiment of the invention; wherein FIG. 5 is a plan view and FIG. 6 is a cross sectional view of the sealed device of FIG. 5;

DESCRIPTION OF THE PREFERRED EMBODIMENTS

Figure 1:
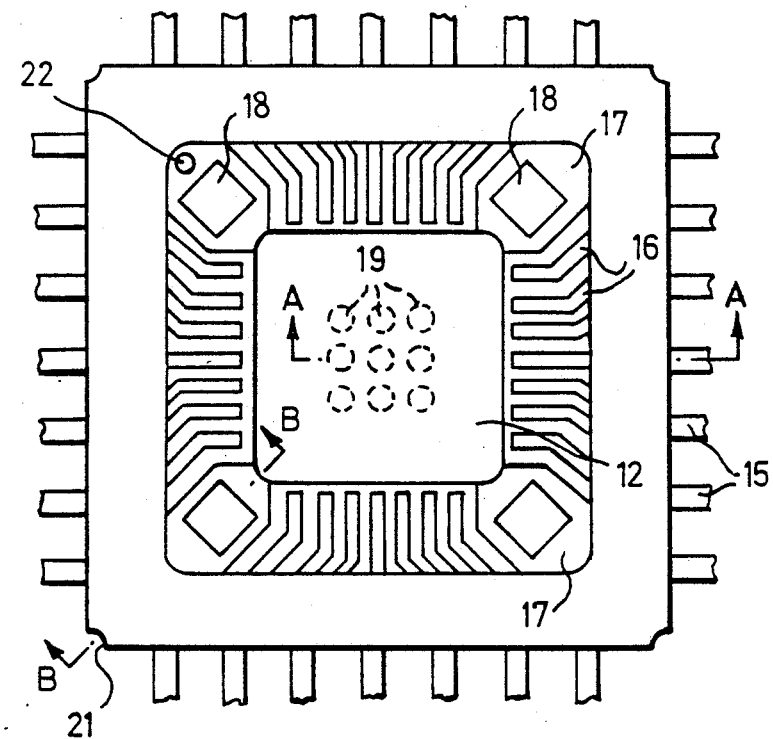
Figure 2:
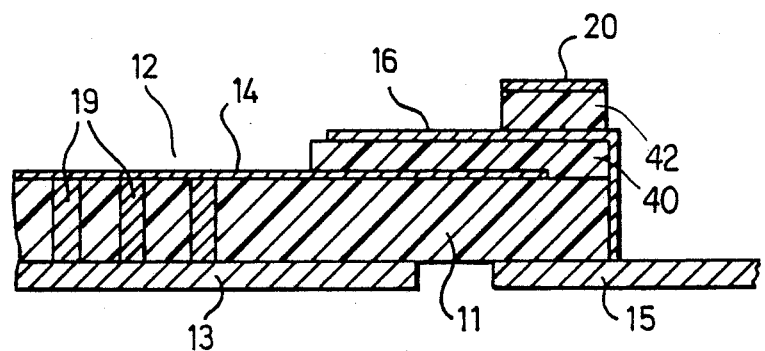
Figure 3:
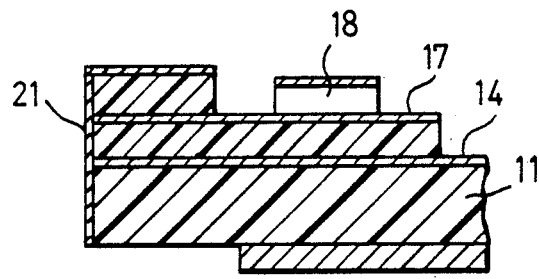

FIGS. 1 through 3 describe the construction of a package of one embodiment of the invention. Reference numeral 11 is a package base made of ceramics. A cavity 12 being provided an integrated circuit chip (not shown) is formed on the center of the package base 11. A ground metal plate 13 made by the copper-tungsten is attached on the bottom of the package base 11. A ground electrode layer 14 is formed on the surface of the cavity 12. The ground metal plate 13 and the ground electrode layer 14 are electrically and thermally connected by tungsten buried into through holes 19 formed in the package base 11. Many wirings 16 for connecting terminals of the integrated circuit chip and outer leads 15 are provided at the periphery of the cavity 12. The outer leads are made of kovar. The thickness of the ground metal plate 13 is controlled so as to be the same thickness as the outer lead 15. Thus, the ground metal plate 13 and the outer lead 15 have the same plane.

Wide metal patterns 17 are formed at the same time as the wirings 16, on each corner of the package base 11. Four de-coupling capacitors 18 are mounted on each wide metal patterns 17. The wirings 16 are formed on the surface of a ring-shaped insulating layer 40. A ring-shaped metal pattern 20 is formed on the outer portion of the package base 11, at a level higher than the wirings 16. The ring-shaped metal pattern 20 is formed on the surface of the ring-shaped insulating layer 42. The ring-shaped metal pattern 20 is utilized to solder the kovar ring for the hermetic sealing.

Metalized patterns 21 are formed on the surroundings of the outer corners of the package base 11. These metalized patterns 21 are electrically connected to the ring-shaped metal patterns 20, wide metal patterns 17 for the decoupling capacitors 18 and ground electrode layer 14 for the integrated circuit chip, respectively. Reference numeral 22 is an index mark indicating the direction of the package.

In this embodiment, de-coupling capacitors are provided within the package as close as possible so that the power supply voltage noise is decreased because the decoupling capacitors effectively compensate the power supply voltage disturbance. The ground metal plate distributes thermal radiation through the metal buried into through holes.

Figure 4:
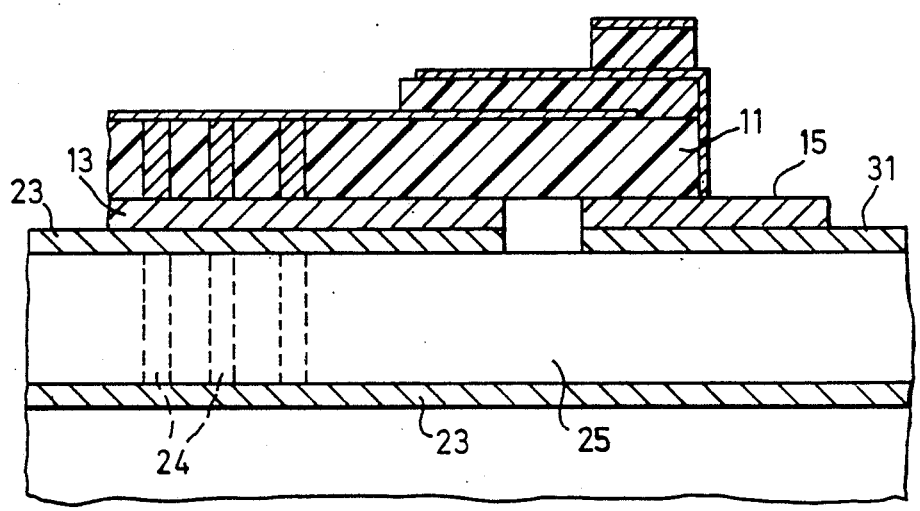
FIG. 4 is a partly cross sectional view to show the assembling state of the package according to the invention on a printed circuit board.

FIG. 4 is a partial cross sectional view to show the assembled state of the package according to the invention on a printed circuit board as one of the applications of the invention. Ground metal layers 23 are formed on a circuit board 25. Ground metal layers 23 are connected by through holes provided in the circuit board 25. Ground metal layers 23 formed on the circuit board 25 are electrically and thermally connected to the ground metal plate 13. A signal metal layer 31 is also formed on the circuit board 25 having the same plane as the ground metal layer 23. Namely, the heights of both layers 23 and 31 are the same. As a result, the outer lead 15 formed on the bottom of the package base 11 and the signal metal layer 31 are connected without unmatching.

Figure 5:
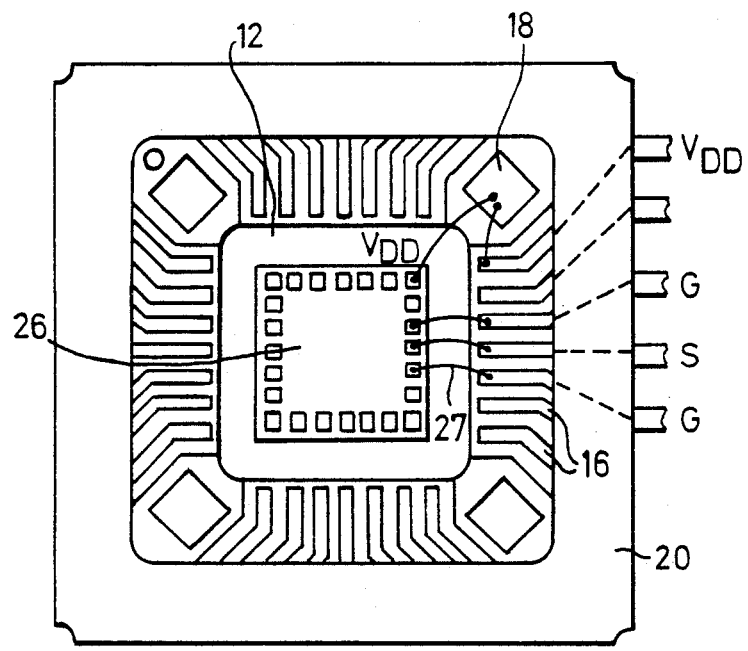
Figure 6:
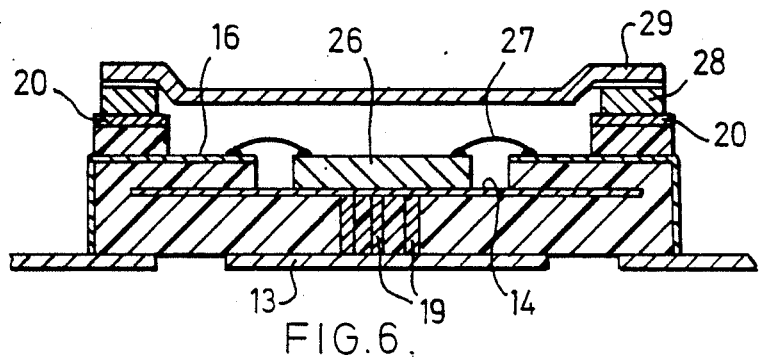

FIGS. 5 and 6 are diagrams illustrating schematic configurations of the first embodiment of the invention. An integrated circuit chip 26 is a GaAs logic integrated circuit chip, for example using the GaAs MESFET, and is fixed on the ground electrode layer 14 at the cavity 12 of the center of the package base 11. Terminals and the wirings 16 are connected using bonding wires 27. Both the power supply terminals of the chip 26 and the power supply wirings on the package base 11 are arranged at the four corners of the package base 11, and upper electrodes of de-coupling capacitors 18 are connected to these power supply terminals and power supply wirings in the shortest distance.

In FIGS. 5 and 6, connection of the power supply voltage $V_{DD}$ to only one corner is shown, however, the other corners are connected the same way. Some terminals treating the high speed signals are arranged being sandwiched between the ground terminals or the D.C. voltage terminals, in the outer terminals, the high speed terminal S is sandwiched by the ground terminals G.

Thereafter, a kovar ring 28 is provided on the ring-shaped metal pattern 20 after the bonding step and the harmetic sealing is done using a metal cover. The kovar ring 28 and the metal cover 29 are electrically connected to the ground electrode layer 14 and the wide metal patterns 17.

In this invention, de-coupling capacitors 18 are arranged within the package together with the chip 26, and the power supply voltage disturbances are effectively compensated. Therefore, this invention enables the high speed performance of the integrated circuit chip 26. And, the decoupling capacitors 18 are arranged on the four corners without wirings and are formed by the same metal of the wirings 16. Therefore, special areas for de-coupling capacitors 18 and the complex construction are not necessary. The structure and the manufacturing steps are very simple.

The metal lid 29 is electrically connected to the ground electrode layer 14 on the bottom of the package base 11, As a result, this invention offers excellent structure to the electric sealed effect. The thermal conductivity of the integrated circuit chip 26 is also improved because, the bottom of the chip 26 is thermally connected to the ground metal plate 13 being on the bottom of the package base 11 through the buried metal within the through holes 19.

Furthermore, the wirings 16 appears as a micro strip line structure, but the wirings function as a pseudo coplanar line by arranging the signal wirings treating the high frequency signal between two ground wirings. Therefore, the crosstalk between signal wirings is effectively restrained. Since the characteristic impedance of the wiring patterns is designed as a pseudo coplanar line, excellent transmission characteristics is obtained. The impedance unmatching between the outer lead attached to the bottom of the package base and the micro strip line formed on the printed circuit is restained by a suitable determination of the thickness of the ground metal plate 13 and the outer lead 15.

Figure 7:
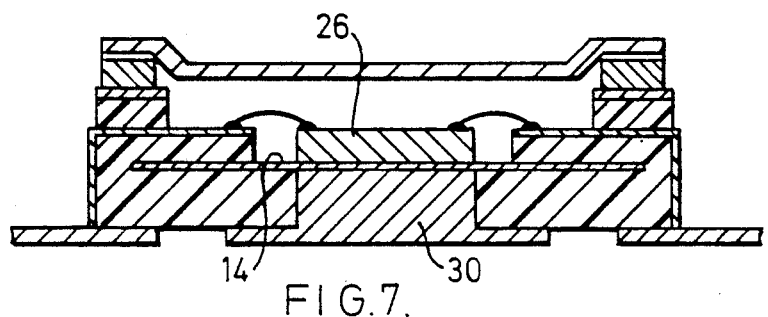
FIG. 7 is a cross sectional view of a semiconductor integrated circuit device according to another embodiment of the invention.

FIG. 7 is a cross sectional view of a semiconductor integrated circuit device according to second embodiment of the invention. In this embodiment, a unified ground electrode 30 instead of the above-mentioned through holes is buried into the package base 11, and it may be directly contacted to the bottom of the chip 26 or through the ground electrode layer 14. The unified ground electrode 30 can transfer more heat than the through hole type.

In the above-mentioned embodiments, numbers of the de-coupling capacitors a limited to four, but these numbers are only exemplary. If the outer leads are provided at two sides of the package, de-coupling capacitors may be set at another side of the package.

What is claimed is:

1. A semiconductor integrated circuit device comprising:
    a package base having a cavity;
    a ground electrode layer formed on the cavity;
    a semiconductor integrated circuit chip provided on the ground electrode layer;
    de-coupling capacitors provided on the cavity;
    bonding wires directly connecting the semiconductor integrated circuit chip to the de-coupling capacitors;
    a ground metal plate provided on the bottom surface of the package base;
    a metal connection means provided through the package base to connect the ground electrode layer and the ground metal plate; and
    outer leads provided on the bottom surface of the package base.

2. The semiconctor integrated circuit device according to claim 1, wherein de-coupling capacitors are arranged at corners of the cavity.

3. The semiconductor integrated circuit device according to claim 1, wherein the de-coupling capacitors are directly connected by the bonding wires to power supply voltage lines.

4. The semiconductor integrated circuit device according to claim 1, wherein the package base is made of ceramics.

5. The semiconductor integrated circuit device according to claim 1, wherein the metal connection means includes metal buried into through holes in the package base.

6. The semiconductor integrated circuit device according to claim 1, wherein the metal connection means is a unified ground electrode.

7. The semiconductor integrated circuit device according to claim 1, wherein the ground metal plate and the outer leads have the same height.

8. The semiconductor integrated circuit device according to claim 1, wherein the semiconductor integrated circuit chip is a GaAs logic integrated circuit.

9. A semiconductor integrated circuit device comprising:
- a ceramics base;
- a ground electrode layer formed on the surface of the ceramics base;
- a semiconductor integrated circuit chip provided on the ground electrode layer;
- a ground metal plate provided on the bottom surface of the ceramics base;
- a first insulating ring-shaped layer provided on the peripheral portion of the ceramics base so as to surround the semiconductor integrated circuit chip;
- signal wirings formed on the first insulating ring-shaped layer;
- de-coupling capacitors provided on the first insulating ring-shaped layer;
- first bonding wirings connecting terminals of the semiconductor integrated circuit chip and signal wirings, second bonding wirings directly connecting terminals of the semiconductor integrated circuit chip and the de-coupling capacitors;
- a second insulating ring-shaped layer provided on a peripheral portion of the first insulating ring-shaped layer;
- a metal sealing lid provided on the second insulating ring-shaped layer; and
- a metal connection means provided through the package base to connect the ground electrode layer and the ground metal plate.

10. The semiconductor integrated circuit device according to claim 9, wherein de-coupling capacitors are arranged on corners of the first insulating ling-shaped layer.

11. The semiconductor integrated circuit device according to claim 9, wherein the metal connection means includes metal buried into through holes of the package base.

12. The semiconductor integrated circuit device according to claim 9, wherein the metal connection means is a unified ground electrode.

13. The semiconductor integrated circuit device according to claim 9, wherein the ground metal plate and the outer lead have the same thickness.

14. The semiconductor integrated circuit device according to claim 9, wherein the semiconductor integrated circuit chip is a GaAs logic integrated circuit.

15. The semiconductor integrated circuit device according to claim 1, wherein the metal connection means is formed in a portion of the package base below the semiconductor integrated circuit chip.

16. The semiconductor integrated circuit device according to claim 9, wherein the metal connection means is formed in a portion of the ceramics base below the semiconductor integrated circuit chip.

* * * * *